United States Patent
Shoji et al.

(10) Patent No.: US 9,909,213 B2
(45) Date of Patent: Mar. 6, 2018

(54) RECURSIVE PUMPING FOR SYMMETRICAL GAS EXHAUST TO CONTROL CRITICAL DIMENSION UNIFORMITY IN PLASMA REACTORS

(71) Applicant: Applied Materials, Inc., Santa Clara, CA (US)

(72) Inventors: Sergio Fukuda Shoji, San Jose, CA (US); Hamid Noorbakhsh, Fremont, CA (US); Jong Mun Kim, San Jose, CA (US); Jason Della Rosa, Campbell, CA (US); Ajit Balakrishna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 719 days.

(21) Appl. No.: 14/452,228

(22) Filed: Aug. 5, 2014

(65) Prior Publication Data
US 2015/0041061 A1 Feb. 12, 2015

Related U.S. Application Data

(60) Provisional application No. 61/864,929, filed on Aug. 12, 2013.

(51) Int. Cl.
*C23C 16/44* (2006.01)
*C23C 16/455* (2006.01)
(Continued)

(52) U.S. Cl.
CPC .... *C23C 16/45591* (2013.01); *C23C 16/4412* (2013.01); *F15D 1/025* (2013.01); *H01J 37/32633* (2013.01); *H01J 37/32834* (2013.01)

(58) Field of Classification Search
None
See application file for complete search history.

(56) References Cited

U.S. PATENT DOCUMENTS 1,473,349 A * 11/1923 Kach ........................ F02M 1/00
138/40
3,840,051 A * 10/1974 Akashi .................... F15D 1/025
138/37
(Continued)

FOREIGN PATENT DOCUMENTS

JP 2007-335510 A 12/2007
JP 2013-016443 A 1/2013

OTHER PUBLICATIONS

PCT Notification of Transmittal of the International Search Report and the Written Opinion of the International Searching Authority for International Application No. PCT/US2014/048843 dated Nov. 11, 2014; 9 total pages.

*Primary Examiner* — Jeffrie R Lund
*Assistant Examiner* — Stanislav Antolin
(74) *Attorney, Agent, or Firm* — Patterson + Sheridan, LLP (57) ABSTRACT

Embodiments of the present invention provide apparatus and methods for reducing non-uniformity and/or skews during substrate processing. One embodiment of the present invention provides a flow equalizer assembly for disposing between a vacuum port and a processing volume in a processing chamber. The flow equalizing assembly includes a first plate having at least one first opening, and a second plate having two or more second openings. The first and second plates define a flow redistributing volume therebetween, and the at least one first opening and the two or more second openings are staggered.

19 Claims, 8 Drawing Sheets

(51) Int. Cl.
  *F15D 1/02*   (2006.01)
  *H01J 37/32*  (2006.01)

(56) References Cited

U.S. PATENT DOCUMENTS

| | | | | |
|---|---|---|---|---|
| 4,559,275 | A * | 12/1985 | Matt | F01D 9/023 137/625.28 |
| 4,817,558 | A * | 4/1989 | Itoh | C23C 16/54 118/715 |
| 5,441,568 | A * | 8/1995 | Cho | C23C 16/4412 118/715 |
| 5,495,872 | A * | 3/1996 | Gallagher | F15D 1/025 138/40 |
| 5,596,152 | A * | 1/1997 | Bergervoet | F15D 1/0005 138/44 |
| 5,605,637 | A * | 2/1997 | Shan | H01J 37/32477 118/723 E |
| 5,997,589 | A * | 12/1999 | Tien | C23C 16/4412 29/25.01 |
| 6,047,903 | A * | 4/2000 | Meyer | A62C 31/02 239/524 |
| 6,120,605 | A * | 9/2000 | Sato | C23C 16/4401 118/715 |
| 6,138,519 | A * | 10/2000 | Bergervoet | G01F 1/12 73/861.79 |
| 6,183,563 | B1 * | 2/2001 | Choi | C23C 16/4412 118/715 |
| 6,186,179 | B1 * | 2/2001 | Hill | F15D 1/0005 138/39 |
| 6,261,408 | B1 * | 7/2001 | Schneider | C23C 16/4412 118/715 |
| 2002/0000196 | A1 * | 1/2002 | Park | C23C 16/45512 118/715 |
| 2002/0045362 | A1 * | 4/2002 | Yang | C23C 16/345 438/791 |
| 2003/0010446 | A1 * | 1/2003 | Kajiyama | C23C 16/4404 156/345.1 |
| 2003/0094052 | A1 * | 5/2003 | Zanker | G01F 1/42 73/861.52 |
| 2003/0131667 | A1 * | 7/2003 | Gallagher | G01F 1/662 73/861.27 |
| 2003/0217810 | A1 * | 11/2003 | Chen | H01L 21/67017 156/345.29 |
| 2003/0227258 | A1 * | 12/2003 | Strang | H01J 37/32449 315/111.21 |
| 2004/0055816 | A1 * | 3/2004 | Gallagher | F16L 55/0331 181/256 |
| 2004/0187780 | A1 * | 9/2004 | Park | H01L 21/6719 118/715 |
| 2005/0109276 | A1 * | 5/2005 | Iyer | C23C 16/345 118/715 |
| 2005/0167052 | A1 * | 8/2005 | Ishihara | H01J 37/32834 156/345.47 |
| 2006/0037702 | A1 * | 2/2006 | Hayashi | H01J 37/32449 156/345.46 |
| 2006/0236932 | A1 * | 10/2006 | Yokogawa | H01J 37/321 118/723 E |
| 2007/0082507 | A1 * | 4/2007 | Iyer | C23C 16/345 438/795 |
| 2007/0095283 | A1 * | 5/2007 | Galewski | C23C 16/4412 118/715 |
| 2007/0266945 | A1 * | 11/2007 | Shuto | C23C 16/4585 118/723 E |
| 2008/0035605 | A1 * | 2/2008 | Takahashi | H01J 37/32844 216/58 |
| 2008/0110567 | A1 * | 5/2008 | Miller | H01J 37/3244 156/345.26 |
| 2008/0110860 | A1 | 5/2008 | Miller et al. | |
| 2008/0149596 | A1 * | 6/2008 | Dhindsa | H01J 37/3244 216/67 |
| 2008/0246277 | A1 * | 10/2008 | Gallagher | F16L 9/147 285/148.13 |
| 2009/0159002 | A1 | 6/2009 | Bera et al. | |
| 2009/0179085 | A1 * | 7/2009 | Carducci | C23C 16/4412 239/289 |
| 2009/0188625 | A1 * | 7/2009 | Carducci | H01J 37/32467 156/345.34 |
| 2009/0236043 | A1 * | 9/2009 | Matsudo | H01J 37/32091 156/345.43 |
| 2009/0250169 | A1 * | 10/2009 | Carducci | H01J 37/32082 156/345.34 |
| 2009/0286405 | A1 | 11/2009 | Okesaku et al. | |
| 2009/0314432 | A1 * | 12/2009 | Iizuka | H01J 37/3244 156/345.27 |
| 2010/0081284 | A1 | 4/2010 | Balakrishna et al. | |
| 2010/0175622 | A1 * | 7/2010 | Yoon | H01J 37/321 118/723 R |
| 2010/0204810 | A1 * | 8/2010 | Saito | H01J 37/32522 700/90 |
| 2010/0206231 | A1 * | 8/2010 | Yoon | H01J 37/32357 118/723 I |
| 2010/0294199 | A1 * | 11/2010 | Tran | C23C 16/4401 118/723 R |
| 2011/0005680 | A1 * | 1/2011 | Balakrishna | C23C 16/4412 156/345.33 |
| 2011/0005685 | A1 * | 1/2011 | Nguyen | H01J 37/16 156/345.43 |
| 2011/0042009 | A1 * | 2/2011 | Lee | H01J 37/3244 156/345.43 |
| 2011/0287632 | A1 * | 11/2011 | Brown | H01J 37/32495 438/716 |
| 2012/0000608 | A1 * | 1/2012 | Kellogg | H01J 37/32091 156/345.43 |
| 2012/0000886 | A1 * | 1/2012 | Honda | H01J 37/18 216/24 |
| 2012/0006615 | A1 * | 1/2012 | Klasing | F02K 3/075 181/224 |
| 2013/0008607 | A1 | 1/2013 | Matsumoto et al. | |
| 2013/0115776 | A1 * | 5/2013 | Abatchev | H01L 21/30655 438/703 |
| 2013/0206066 | A1 * | 8/2013 | Han | H01L 21/02104 118/715 |

* cited by examiner

RECURSIVE PUMPING FOR SYMMETRICAL GAS EXHAUST TO CONTROL CRITICAL DIMENSION UNIFORMITY IN PLASMA REACTORS

CROSS-REFERENCE TO RELATED APPLICATIONS

This application claims priority to U.S. Provisional Patent Application Ser. No. 61/864,929, filed on Aug. 12, 2013, which herein is incorporated by reference.

BACKGROUND

Field

Embodiments of the present invention relate to apparatus and methods for processing semiconductor substrates. More particularly, embodiments of the present invention provide apparatus and methods for reducing non-uniformity and/or skews during substrate processing.

Description of the Related Art

Electronic devices, such as flat panel displays and integrated circuits commonly are fabricated by a series of process steps in which layers are deposited on a substrate and the deposited material is etched into desired patterns. The process steps commonly include physical vapor deposition (PVD), chemical vapor deposition (CVD), plasma enhanced CVD (PECVD), and other plasma processing. Specifically, a plasma process requires supplying a process gas mixture to a vacuum chamber, and applying electrical or electromagnetic power (RF power) to excite the process gas into a plasma state. The plasma decomposes the gas mixture into ion species that perform deposition, etch, implant or other processes.

One problem encountered with plasma processes is the difficulty associated with establishing uniform plasma density over the substrate surface during processing, which leads to non-uniform processing between the center and edge regions of the substrate and non-uniform processing azimuthally within center and edge regions. One reason for the difficulty in establishing uniform plasma density involves gas flow skews due to asymmetry in the physical process chamber design. Such skews not only result in naturally, azimuthal, non-uniform plasma density, but also make it difficult to use other processing variables or "knobs" to control center-to-edge plasma uniformity.

Therefore, a need exists for a plasma processing apparatus that improves gas flow symmetry for improved plasma uniformity control.

SUMMARY

Embodiments of the present invention provide apparatus and methods for reducing non-uniformity and/or skews during substrate processing.

One embodiment of the present invention provides a flow equalizer assembly for disposing between a vacuum port and a processing volume in a processing chamber. The flow equalizing assembly includes a first plate having at least one first opening, and a second plate having two or more second openings. The first and second plates define a flow redistributing volume therebetween, and the at least one first opening and the two or more second openings are staggered.

Another embodiment of the present invention provides an apparatus for processing one or more substrates. The apparatus includes a chamber body defining a processing volume, wherein a pumping port is formed through the chamber body for connection with a vacuum pump, a substrate support disposed in the processing volume for supporting a substrate thereon, a gas delivery assembly configured to deliver one or more processing gas to the processing volume, and a flow equalizer assembly disposed between the processing volume and the pumping port. The flow equalizer assembly includes a first plate having at least one first opening, and a second plate having two or more second openings. The first plate faces the vacuum port. The first and second plates define a flow redistributing volume therebetween, the at least one first opening and the two or more second openings are staggered, and the second plate faces the processing volume.

Yet another embodiment of the present invention provides a method for pumping a processing chamber. The method includes directing fluid flow from a processing volume to a vacuum port through a flow equalizer assembly. The flow equalizer assembly includes a first plate having at least one first opening, and a second plate having two or more second openings. The at least one first opening and the two or more second openings are staggered. Directing the fluid flow includes flowing one or more gases from the processing volume through the two or more second openings to a flow redistributing volume defined between the first and second plates, and flowing the one or more gases from the flow redistributing volume through the at least one first opening to the vacuum port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide various apparatus and methods for improving gas flow symmetry. In one embodiment, a flow equalizing assembly positioned between a processing volume and a vacuum port at a non-symmetrical position relative to the processing volume is provided. The flow equalizing assembly includes at least two plates each having openings formed therethrough. The flow equalizing assembly forms a plurality of flow paths so that different regions of the processing volume are at substantially the same distance from the vacuum port, thus, achieving symmetrical pumping conductance. In addition to reducing flow non-symmetry caused by non-symmetrical location of a vacuum port, the flow equalizing assembly can also be used to reduce other non-symmetries in a processing chamber, such as conductance and RF non-symmetry caused by a slit valve door. In one embodiment, a flow asymmetry may be introduced in the flow equalizing assembly to compensate for RF asymmetry to obtain processing symmetry. The flow equalizing assembly enables the symmetry of fluid flow in a processing chamber to be tuned, thus, reducing processing skew and improving uniformity of processing.

Figure 1A:
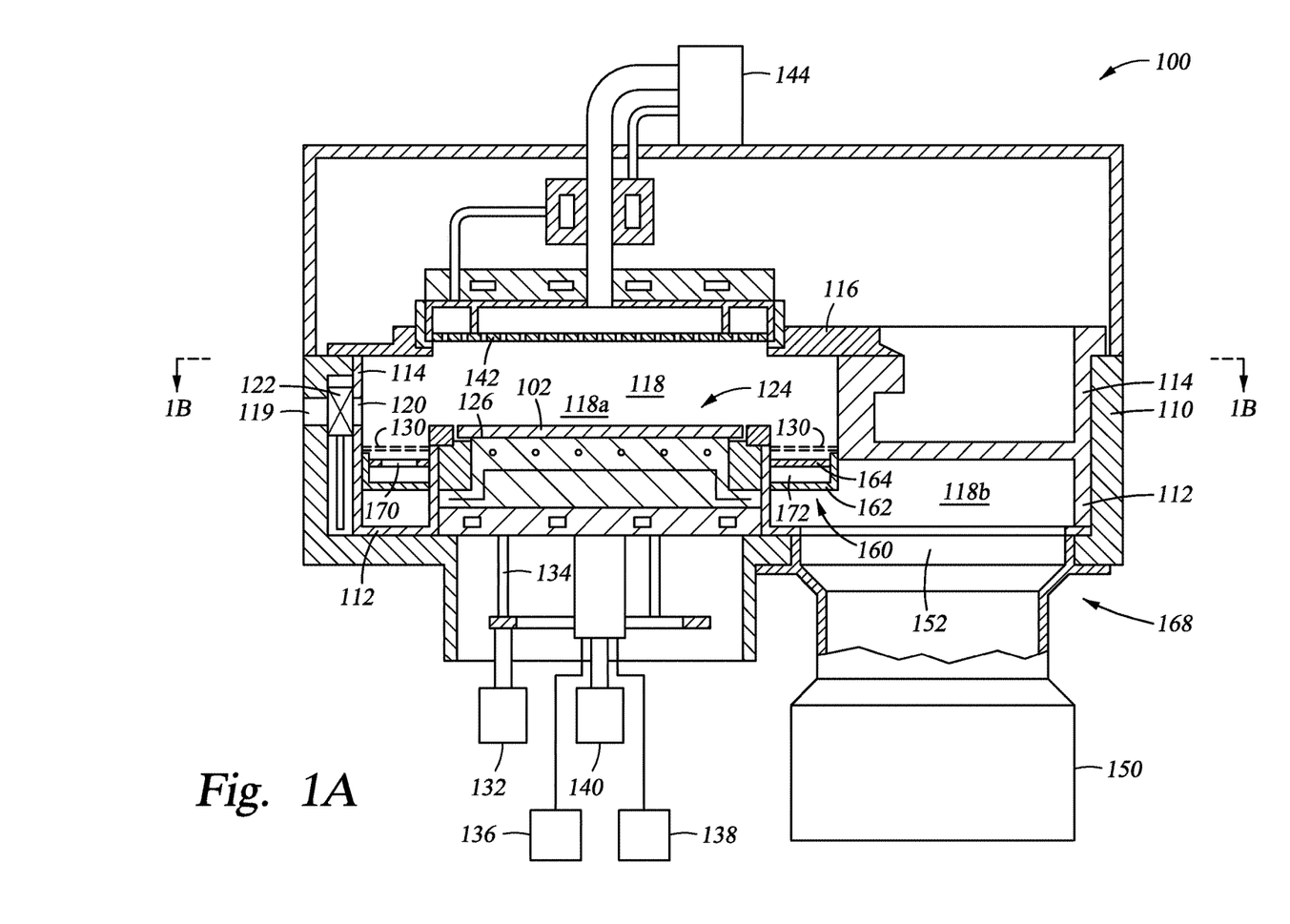
FIG. 1A is a schematic sectional view of a plasma processing chamber according to one embodiment of the present invention.

FIG. 1A is a schematic sectional view of a plasma processing chamber 100 according to one embodiment of the present invention. The plasma processing chamber 100 includes a flow equalizer assembly 160 to obtain fluid flow symmetry between a processing volume and a vacuum port. The flow equalizer assembly 160 may be used to obtain a symmetrical fluid flow, or may be used to tune the symmetry of the fluid flow to compensate for other chamber asymmetries to obtain symmetrical processing results. The plasma processing chamber 100 may be configured to process a variety of substrates, such as semiconductor substrates and reticles, and accommodating a variety of substrate sizes.

The plasma processing chamber 100 includes a chamber body 110. A bottom chamber liner 112 and a top chamber liner 114 are disposed inside the chamber body 110. The bottom chamber liner 112, the top chamber liner 114 and a chamber lid 116 define a chamber volume 118. Slit valve openings 119, 120 may be formed through the chamber body 110 and the top chamber liner 114 to allow passage of a substrate 102 and substrate transfer mechanism (not shown). A slit valve door 122 may be utilized to selectively open and close the slit valve openings 119, 120.

A substrate support assembly 124 is disposed in the chamber volume 118. The substrate support assembly 124 has a substrate supporting surface 126 for supporting a substrate thereon. A lift 132 may be coupled to lifting pins 134 to raise the substrate 102 from and to lower the substrate 102 on to the substrate support assembly 124. The substrate support assembly 124 may be an electrostatic chuck coupled to a chucking power source 136 to secure the substrate 102 thereon. The substrate support assembly 124 may also includes one or more embedded heating elements coupled to a heating power source 138 for heating the substrate 102 during processing. A cooling fluid source 140 may provide cooling or heating and adjust temperature profile of the substrate 102 being processed.

An optional plasma screen 130 may be disposed surrounding the substrate support assembly 124. The plasma screen 130 may be positioned at a vertical level similar to the vertical level of the substrate supporting surface 126 and separates the chamber volume 118 into a processing volume 118a and a lower volume 118b located below the plasma screen 130.

A showerhead assembly 142 may be positioned above the processing volume 118a to deliver one or more processing gases from a gas delivery system 144 to the processing volume 118a. Alternatively, the plasma processing chamber 100 may also include an antenna assembly for generating inductively coupled plasma in the plasma processing chamber 100.

A vacuum pump 150 is in fluid communication with the chamber volume 118 to maintain a low pressure environment within the processing volume 118a. In one embodiment, the vacuum pump 150 may be coupled to the lower chamber volume 118b through a vacuum port 152 formed in the bottom chamber liner 112.

As shown in FIG. 1A, the vacuum port 152 is positioned at a bottom of the lower volume 118b and laterally offset from the substrate support assembly 124, and thus, the vacuum port 152 is located non-symmetrical relative to the substrate support assembly 124. The flow equalizer assembly 160 is disposed around the substrate support assembly 124 to azimuthally equalize the gas flow passing from the processing volume 118a to the lower volume 118b. In one embodiment, the flow equalizer assembly 160 may be disposed under the optional plasma screen 130. The vacuum pump 150 pumps out gas and process by products from the processing volume 118a through the vacuum port 152, the lower volume 118b and flow paths formed through the flow equalizer assembly 160.

The flow equalizer assembly 160 may include two or more plates 162, 164 spaced apart from one another. A flow re-distributing volume 172 is defined between neighboring plates 162, 164. Each of the plates 162, 164 includes openings 168, 170 formed therethrough. During operation, driven by vacuum suction from vacuum port 152, gases and particles exit the processing volume 118a through the openings 170 of the plate 164, flow through the flow re-distributing volume 172, then flow through the openings 168 of the plate 162 towards the vacuum port 152. Numbers, size, and/or locations of the openings 168, 170 are arranged so that flow paths between the openings 170 to the openings 168 through the flow re-distributing volume 172 can be tuned to correct processing asymmetries by either adjusting or eliminating the flow asymmetries between the processing volume 118a and the vacuum port 152.

In one embodiment of the present invention, each of the two or more plates 162, 164 may be a circular plate having a central opening for receiving the substrate support assembly 124 so that the flow equalizer assembly 160 is disposed around the substrate support assembly 124. In one embodiment, the top most plate 164 may be at a horizontal level similar to or slightly lower than the substrate supporting surface of the substrate support assembly 124. The openings 170 may be substantially evenly distributed along an outer edge of the substrate support assembly 124. The circular plates 162, 164 may be arranged parallel to each other. The openings 168 of the plate 162 and the openings 170 of the plate 164 may be arranged in a vertically staggered manner, instead of vertically aligned with each other, to enable flow equalizing within the flow re-distributing volume 172.

The number, shape and sizes of openings 168 and the number of openings 170 may be the same or different. In one embodiment, the number of openings 170 on the plate 164 which is positioned closer to the processing volume 118a is greater than the number of openings 168 on the plate 162 which is positioned closer to the vacuum port 152. In one embodiment, the number of openings 170 may be at least twice as many as the number of the openings 168.

The number, size and/or location of openings in the plates 162, 164 may be arranged to provide equal distances between the vacuum port 152 and different regions of the substrate support assembly 124 so that processing gases within the processing volume 118a can be uniformly and symmetrically pumped around the substrate support assembly 124.

Figure 1B:
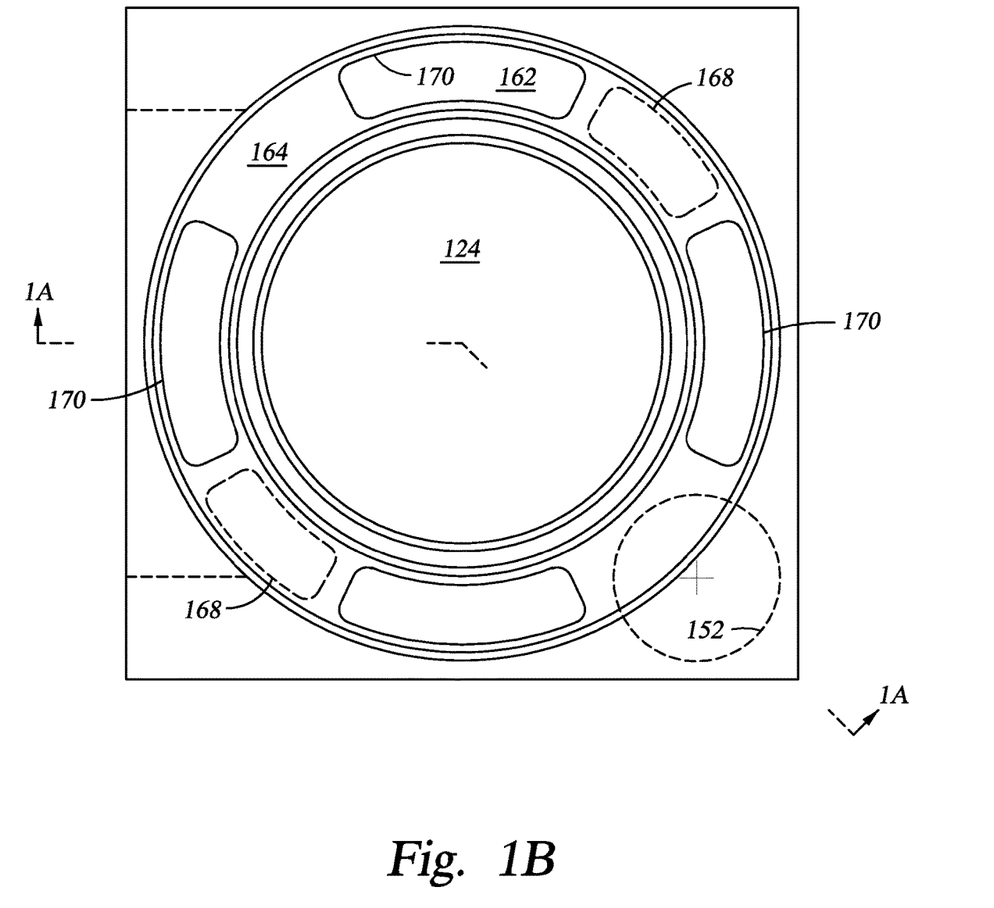
FIG. 1B is a schematic top view of the plasma processing chamber of FIG. 1A with a chamber lid removed.

FIG. 1B is a schematic top view of the plasma processing chamber 100 of FIG. 1A with the lid 116 removed. As shown in FIG. 1B, the vacuum port 152 is positioned off center from the centerline of the substrate support assembly 124. The plates 164, 162 are disposed concentric to the substrate support assembly 124. The openings 170 of the top plate 164 may be evenly distributed around the substrate support assembly 124. The number of openings 170 of the top late 164 may be at least twice as many as the number of openings 168 of the bottom plate 162. In the embodiment of FIG. 1B, there are two openings 168 on the bottom plate 162. The two openings 168 are positioned at equal distance away from the vacuum port 152. There are four openings 170 on the top plate 164. The top plate 164 is positioned in an angle so that each opening 170 is located at the substantially the same distance away from a closest opening 168. As a result, each opening 170 on the top plate 164 is positioned at substantially the same distance away from the vacuum port 152, thus reducing the non-symmetry in flow paths through the flow equalizer assembly 160.

In the embodiment of FIG. 1B, each of the openings 170 is similar in shape and size and each of the openings 168 is similar in shape and size. Alternative, the shape and/or size of each opening 170 or opening 168 may be unique or different to provide a target flow resistance.

Although two plates 164, 162 are shown in the flow equalizer assembly 160 of FIG. 1A, additional plates may be included to tune the flow distribution through the flow equalizer assembly 160. For example, an additional plate may be disposed above the top plate 164. The additional plate may have twice as many openings as the top plate 164 to generate a recursive flow splitting and equalizing effect.

Figure 2A:
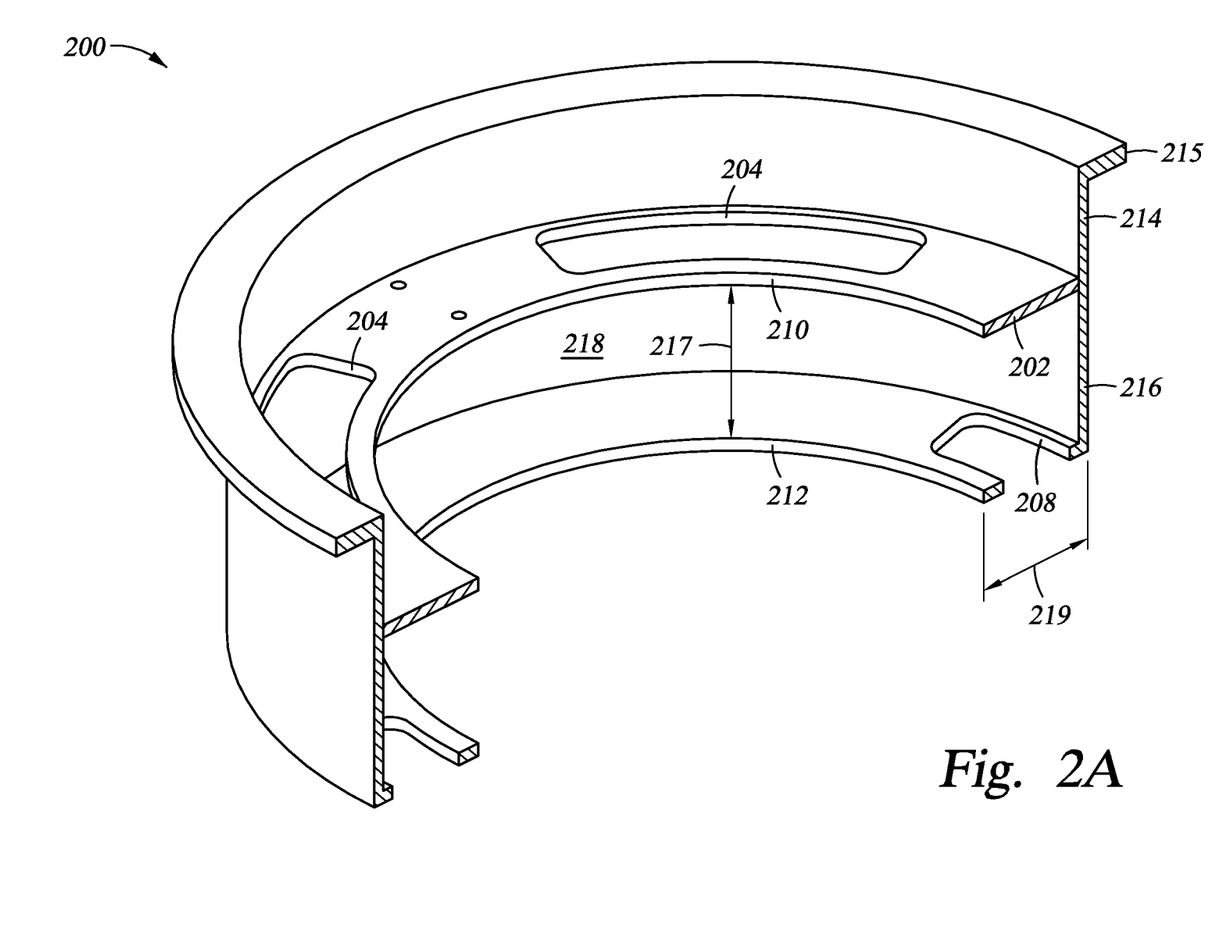
FIG. 2A is a schematic perspective sectional view of a flow equalizer assembly according to one embodiment of the present invention.

FIG. 2A is a schematic perspective view of a flow equalizer assembly 200 according to one embodiment of the present invention. The flow equalizer assembly 200 includes a first plate 202 having a plurality of openings 204 for receiving fluid flow from a processing volume and a second plate 206 having two or more openings 208 for directing fluid flow towards a vacuum port. The first plate 202 and the second plate 206 may be positioned parallel to each other.

The first plate 202 may include a central opening 210 and the second plate 206 may include a central opening 212. The central openings 210, 212 are sized to receive a substrate support assembly so that the first plate 202 and the second plate 206 are surrounds the substrate support assembly.

A sidewall 214 may extend above the first plate 202 from an outer perimeter. The sidewall 214 may be symmetrical, for example having a circular shape or a normal polygonal shape, to retain a symmetrical volume above the substrate support assembly. In one embodiment, the sidewall 214 may include an upper lip 215 so that the flow equalizer assembly 200 can be supported by a chamber liner.

A sidewall 216 may connect between the first plate 202 and the second plate 206 to enclose a flow re-distributing volume 218. The sidewall 216 may be symmetrical, for example being circular. The distribution, shape, size and/or relative locations of the openings 204, 208 and the height of the flow re-distributing volume 218 may be tuned to achieve flow redistributing effect.

The plurality of openings 204 may be evenly distributed along the first plate 202. A spacing 217 between the first plate 202 and the second plate may be provided to achieve targeted flow patterns. In one embodiment, a ratio of the spacing 217 and a width 219 of the flow re-distributing volume 218 may be between about 0.4 to about 0.5.

Figure 2B:
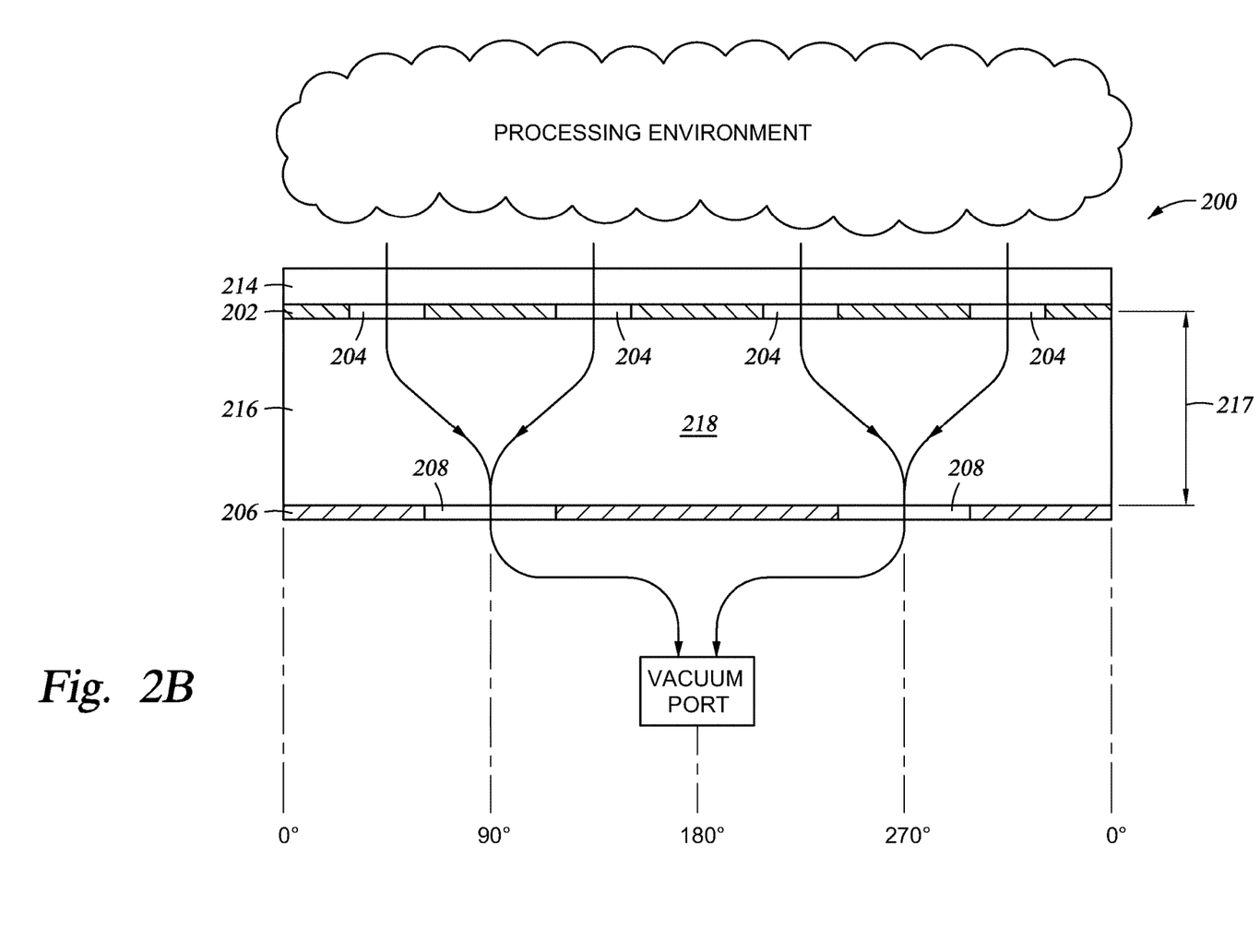
FIG. 2B is a schematic cylindrical map projection of the flow equalizer assembly of FIG. 2A showing azimuthal flow distributions.

FIG. 2B is a schematic cylindrical map projection of the flow equalizer assembly 200 showing azimuthal flow distributions. The flow equalizer assembly 200 is arranged so that each opening 204 of the first plate 202 is substantially equal distance to the vacuum port. Since the openings 204 are positioned along an edge region of the plasma or processing environment, the processing environment can be symmetrically vacuumed by the vacuum port through the flow equalizer assembly 200. The two openings 208 closest to the vacuum port may be positioned at equal distances from the vacuum port. As shown in FIG. 2B, the vacuum port is located at 180 degrees, while the openings 208 are positioned at 90 degrees and 270 degrees respectively. Similarly, the openings 204 are arranged such that each opening 204 is at substantial the same distance to a closest opening 208. In FIG. 2B, there are four openings 204 positioned 90 degrees apart at 45 degrees, 135 degrees, 225 degrees and 315 degrees.

Additional plates can be positioned above the first plate 202 to provide for further equalizing. For example, an additional having twice as many openings as the first plate 202 may be positioned above the first plate 202. In the embodiment of FIG. 2B, the openings in the additional plate may include eight openings positioned 45 degrees apart at 22.5 degrees, 67.5 degrees, 112.5 degrees, 157.5 degrees, 202.5 degrees, 247.5 degrees, 292.5 degrees, and 337.5 degrees. Alternatively, the additional plate may include only four openings positioned at in staggered manner relative to openings 204 to avoid increased flow resistance caused by smaller openings.

Figure 3A:
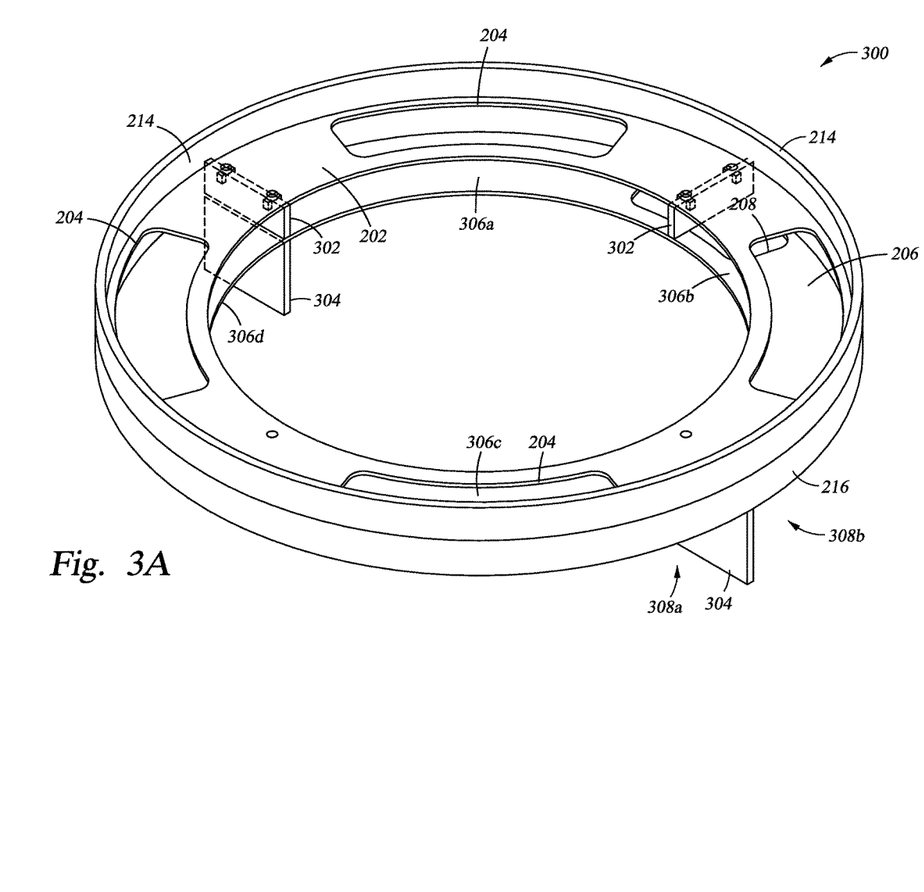
FIG. 3A is a schematic perspective view of a flow equalizer assembly including one or more dividers according to one embodiment of the present invention.

FIG. 3A is a schematic perspective view of a flow equalizer assembly 300 including one or more dividers 302 according to one embodiment of the present invention. The flow equalizer assembly 300 is similar to the flow equalizer assembly 200 described above except that the two or more dividers 302 may be positioned between the first plate 202 and the second plate 206.

The dividers 302 cut the flow re-distributing volume 218 into two or more isolated sub-volumes 306a, 306b, 306c, 306d. Each sub-volume 306a, 306b, 306c, 306d opens to at least one opening 204 of the first plate 202 and one opening 208 of the second plate 206. The dividers 302 provide additional direction to the flow passing through the flow equalizer assembly 300 to improve flow symmetry tuning. In the embodiment shown in FIG. 3A, two or more dividers 302 may be positioned above the openings 208 dividing each opening 208 into two sections so that each opening 204 of the first plate 202 is exposed to similar level of suction.

Optionally, the flow equalizer assembly 300 may also include dividers 304 attached to the second plate 206 isolating the two openings 208 from each other. When installed, one divider 304 may be positioned over the vacuum port so that each opening 208 is exposed to equal amount of suction from a vacuum pump.

Figure 3B:
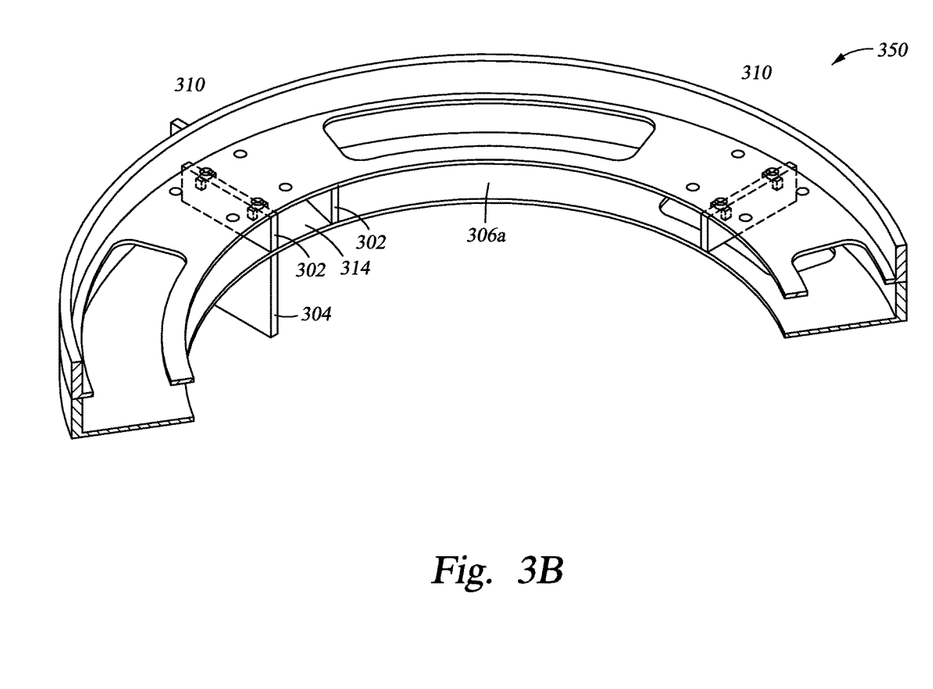
FIG. 3B is a schematic sectional perspective view of a flow equalizer including one or more adjustable dividers according to one embodiment of the present invention.

FIG. 3B is a schematic sectional perspective view of a flow equalizer assembly 350 including one or more adjustable dividers according to one embodiment of the present invention. The flow equalizer assembly 350 is similar to the flow equalizer assembly 300 except the dividers 302 may be adjustable. The location of each divider 302 may be adjusted to obtain target flow resistance in each sub-volume 306. In one embodiment, each divider 302 may be positioned in one of a plurality of pre-determined locations. For example, a plurality of notches 310 may be formed under the first plate 202 for secure a divider 302 at a plurality of locations.

In one embodiment, the dividers 302 may be arranged to enclose one or more isolated sections 314 within the flow re-distributing volume. The isolated sections 314 is not fluidly connected to any openings of the first plate 202 or the second plate 206. The isolated sections 314 may be used to reduce flow stagnation.

Figure 4A:
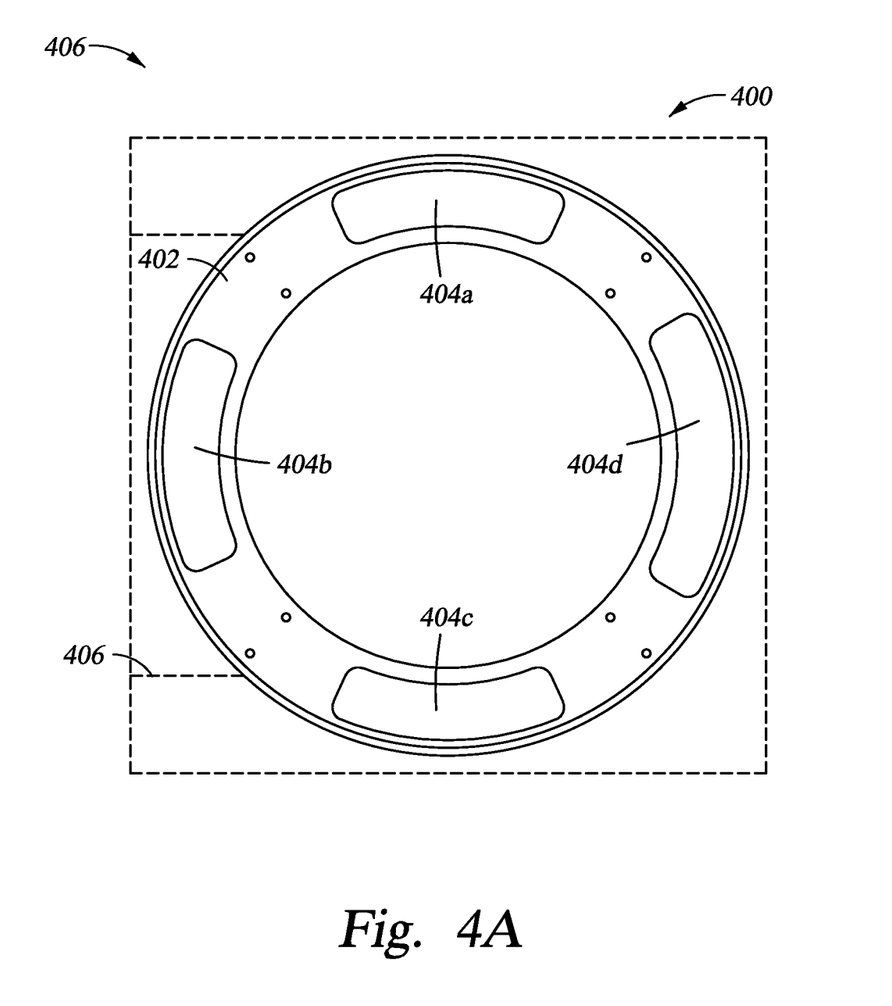
FIG. 4A is a schematic top view of a flow equalizing plate according to one embodiment of the present invention.

FIG. 4A is a schematic top view of a flow equalizing plate 400 for using in a flow equalizer assembly according to one embodiment of the present invention. The flow equalizing plate 400 may include a ring shaped planar body 402 having a plurality of openings 404a, 404b, 404c, 404d formed therethrough. The shape, size, and distribution of the plurality of openings 404a, 404b, 404c, 404d may be varied according to flow requirement and chamber geometry. In one embodiment, the plurality of openings 404a, 404b, 404c, 404d may have may be of the same shape or side and be evenly distributed. Alternatively, one or more openings 404a, 404b, 404c, 404d may be varied to compensate chamber geometry. For example, an opening 404d positioned adjacent to a slit valve door 406 of a processing chamber may be of a different size or shape to compensate the non-symmetry of the slit valve door 406.

Figure 4B:
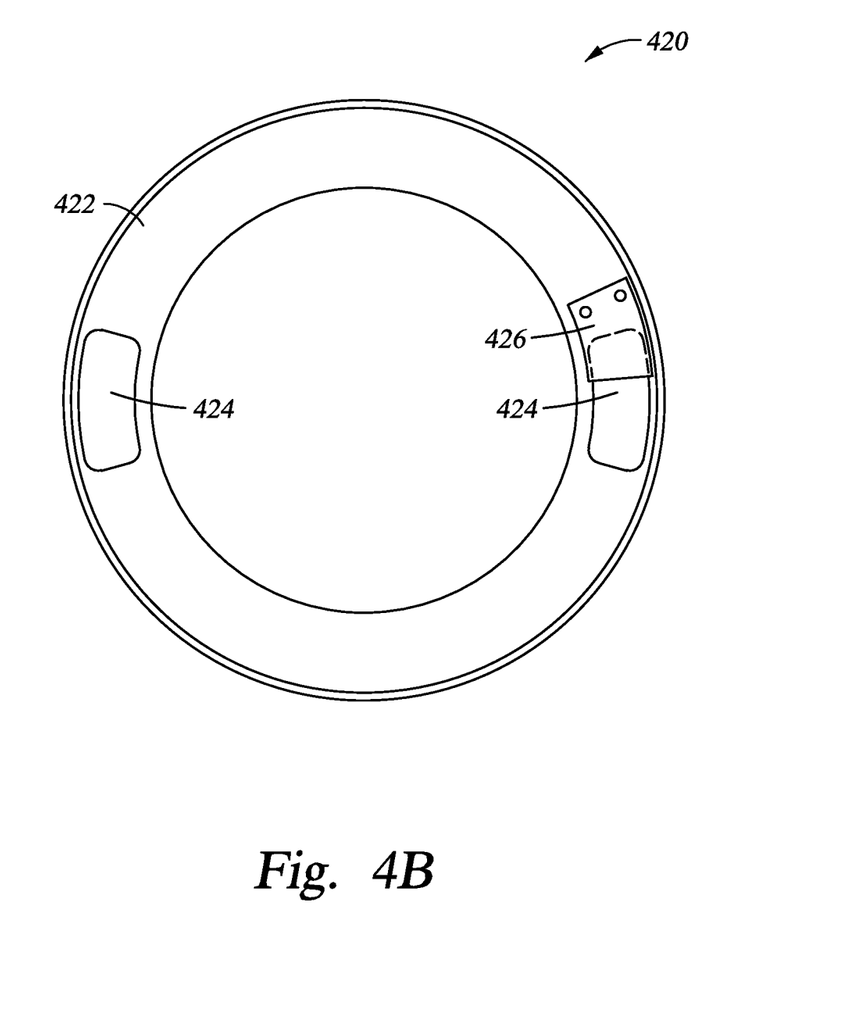
FIG. 4B is a schematic top view of a flow equalizing plate according to one embodiment of the present invention.

FIG. 4B is a schematic top view of a flow equalizing plate 420 according to one embodiment of the present invention. The flow equalizing plate 420 may include a ring shaped planar body 422 having two or more openings 424 for directing fluid flow there through. In one embodiment, the flow equalizing plate 420 may include a shutter disk 426 to selectively close a portion of the opening 424 to adjust flow resistance through a particular opening.

Embodiments of the present invention may be used alone or in combination. Even though plasma chambers are described in the above embodiments, flow equalizer assemblies according to embodiments of the present invention may be used in any suitable chambers.

While the foregoing is directed to embodiments of the present invention, other and further embodiments of the invention may be devised without departing from the basic scope thereof, and the scope thereof is determined by the claims that follow.

The invention claimed is:

1. A flow equalizer assembly for disposing between a vacuum port and a processing volume in a processing chamber, comprising:
   a first plate having a central opening and at least one first opening surrounding the central opening; and
   a second plate having a central opening and two or more second openings surrounding the central opening, wherein each of the first plate and the second plate is a circular plate, and the first plate and the second plate are positioned parallel to each other, wherein the first plate and the second plate define a flow redistributing volume therebetween, and the at least one first opening and the two or more second openings are staggered, and wherein the number of the second openings is greater than the number of the first openings; and
   two or more first dividers disposed between the first plate and the second plate, wherein the two or more first dividers divide the flow redistributing volume into multiple sections, and at least one section directs a flow from two second openings to one first opening.

2. The flow equalizer assembly of claim 1, wherein the two or more second openings are evenly distributed azimuthally along the second plate.

3. The flow equalizer assembly of claim 1, further comprising an outer wall attached to outer edges of the first and second plates.

4. The flow equalizer assembly of claim 1, wherein the number of the first openings is twice the number of the second openings.

5. The flow equalizer assembly of claim 1, wherein at least one of the multiple sections is disconnected from the first openings and the second openings.

6. The flow equalizer assembly of claim 1, wherein one or more of the plurality of first dividers are adjustable.

7. The flow equalizer assembly of claim 1, further comprising one or more second dividers attached to the first plate, wherein the one or more second dividers and the two or more first dividers are coupled to opposite sides of the first plate.

8. The flow equalizer assembly of claim 1, wherein the two or more second openings have different size or shape.

9. The flow equalizer assembly of claim 1, further comprising at least one or more shutters partially disposed over one or more of the first or second openings.

10. The flow equalizer assembly of claim 1, further comprising a third plate having a plurality of third openings, wherein the third plate is disposed parallel to the first plate and the second plate, a second flow redistributing volume is defined between the second plate and the third plate, and the plurality of third openings and the two or more second openings are staggered.

11. The flow equalizer assembly of claim 10, wherein the number of the third openings is greater than the number of the second openings.

12. The flow equalizer assembly of claim 1, wherein a ratio of a spacing between the first plate and the second plate and a width of the first plate and the second plate is between about 0.4 to about 0.5.

13. An apparatus for processing one or more substrates, comprising:
   a chamber body defining a processing volume, wherein a pumping port is formed through the chamber body for connection with a vacuum pump;
   a substrate support disposed in the processing volume for supporting a substrate thereon;
   a gas delivery assembly configured to deliver one or more processing gas to the processing volume; and
   a flow equalizer assembly disposed between the processing volume and the pumping port, wherein the flow equalizer assembly comprises:
      a first plate having a central opening and at least one first opening, wherein the first plate faces the vacuum port; and
      a second plate having a central opening and two or more second openings, wherein the first plate and second plate define a flow redistributing volume therebetween, the at least one first opening and the two or more second openings are staggered, and the second plate faces the processing volume, and the number of the second openings is greater than the number of the first openings, wherein the flow equalizer assembly is positioned radially outwards the substrate support assembly, each of the first plate and the second plate of the flow equalizer assembly is a circular plate having a central opening for receiving the substrate support assembly, and the first plate and the second plate are positioned parallel to each other; and two or more first dividers disposed between the first plate and the second plate, wherein the two or more first dividers divide the flow redistributing volume into multiple sections, and at least one section directs a flow from two second openings to one first opening.

14. The apparatus of claim 13, wherein the two or more second openings are evenly distributed azimuthally along the second plate.

15. The apparatus of claim 13, wherein the one or more of the plurality of first dividers are adjustable.

16. The apparatus of claim 13, wherein the flow equalizer assembly further comprises one or more second dividers attached to the first plate, wherein the one or more second dividers and the two or more first dividers are coupled to opposite sides of the first plate.

17. The apparatus of claim 16, wherein the first plate includes two first openings, and one of the second dividers is positioned over the vacuum port so that each of the two first openings is exposed to equal amount of suction from the vacuum port.

18. The apparatus of claim 13, wherein a ratio of a spacing between the first plate and the second plate and a width of the first plate and the second plates is between about 0.4 to about 0.5.

19. An apparatus for processing one or more substrates, comprising:

a chamber body defining a processing volume, wherein a pumping port is formed through the chamber body for connection with a vacuum pump;

a substrate support disposed in the processing volume for supporting a substrate thereon;

a gas delivery assembly configured to deliver one or more processing gas to the processing volume; and a flow equalizer assembly disposed between the processing volume and the pumping port, wherein the flow equalizer assembly comprises:

a first plate having a central opening and at least one first opening, wherein the first plate faces the vacuum port;

a second plate having a central opening and two or more second openings, wherein the first plate and second plate define a flow redistributing volume therebetween, the at least one first opening and the two or more second openings are staggered, and the second plate faces the processing volume, and the number of the second openings is greater than the number of the first openings, wherein the flow equalizer assembly is positioned radially outwards the substrate support assembly, each of the first plate and the second plate of the flow equalizer assembly is a circular plate having a central opening for receiving the substrate support assembly, and the first plate and the second plate are positioned parallel to each other; and a third plate having a plurality of third openings, the first plate and the third plate are disposed on opposite sides of the second plate, and the number of the third openings is greater than the number of the second openings.

* * * * *